United States Patent
Huang et al.

(10) Patent No.: US 9,437,712 B2
(45) Date of Patent: Sep. 6, 2016

(54) HIGH PERFORMANCE SELF ALIGNED CONTACTS AND METHOD OF FORMING SAME

(71) Applicant: Taiwan Semiconductor Manufacturing Company, Ltd., Hsin-Chu (TW)

(72) Inventors: Yen-Chun Huang, New Taipei (TW); Bor Chiuan Hsieh, Taoyuan (TW); Tai-Chun Huang, Hsin-Chu (TW); Chia-Ying Lee, New Taipei (TW); Tze-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 20 days.

(21) Appl. No.: 14/201,391

(22) Filed: Mar. 7, 2014

(65) Prior Publication Data

US 2015/0255275 A1    Sep. 10, 2015

(51) Int. Cl.
*H01L 23/48*    (2006.01)
*H01L 29/66*    (2006.01)
*H01L 21/311*    (2006.01)

(52) U.S. Cl.
CPC ... *H01L 29/66545* (2013.01); *H01L 21/31116* (2013.01)

(58) Field of Classification Search
CPC ............... H01L 29/66545; H01L 21/31116
See application file for complete search history.

(56) References Cited

U.S. PATENT DOCUMENTS

| | | | | |
|---|---|---|---|---|
| 6,815,770 B1* | 11/2004 | Chien | ............... | H01L 29/66477 257/335 |
| 2005/0158935 A1* | 7/2005 | Shin | .................. | H01L 21/28114 438/197 |
| 2006/0240654 A1* | 10/2006 | Wei | .................... | H01L 21/76897 438/586 |
| 2007/0254442 A1* | 11/2007 | Manger | ............. | H01L 21/28247 438/304 |
| 2008/0261385 A1* | 10/2008 | Jawarani | ............. | H01L 29/7843 438/517 |
| 2009/0155968 A1* | 6/2009 | Min | .................. | H01L 21/31105 438/261 |
| 2013/0071977 A1* | 3/2013 | Scheiper | .......... | H01L 21/76224 438/299 |
| 2014/0038398 A1* | 2/2014 | Heo | .................. | H01L 21/02068 438/585 |

* cited by examiner

*Primary Examiner* — Nicholas Tobergte
(74) *Attorney, Agent, or Firm* — Slater Matsil, LLP

(57) ABSTRACT

A method embodiment includes forming a protective liner over the substrate and forming an inter-layer dielectric over the protective liner. The protective liner covers a sidewall of a gate spacer. The method further includes patterning a contact opening in the first ILD to expose a portion of the protective liner. The portion of the protective liner in the contact opening is removed to expose an active region at a top surface of the semiconductor substrate. A contact is formed in the contact opening. The contact is electrically connected to the active region.

20 Claims, 6 Drawing Sheets

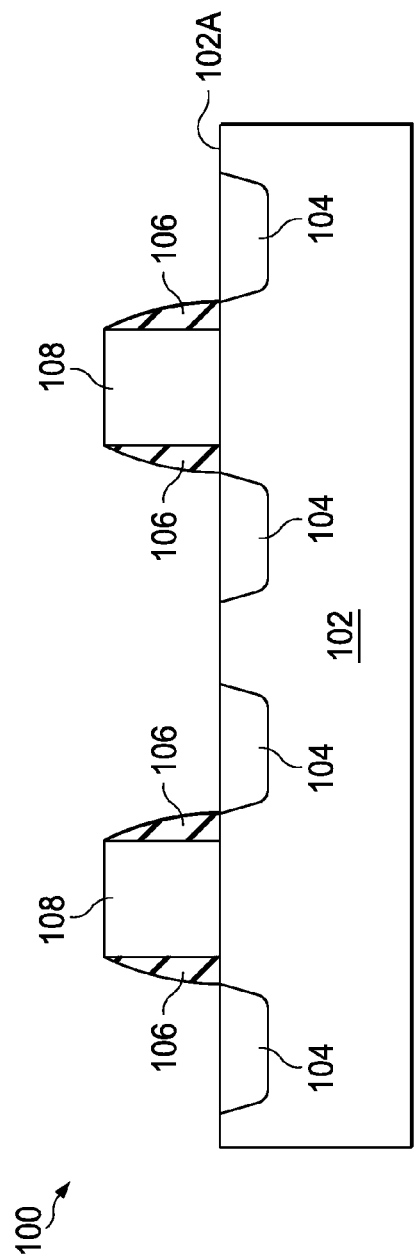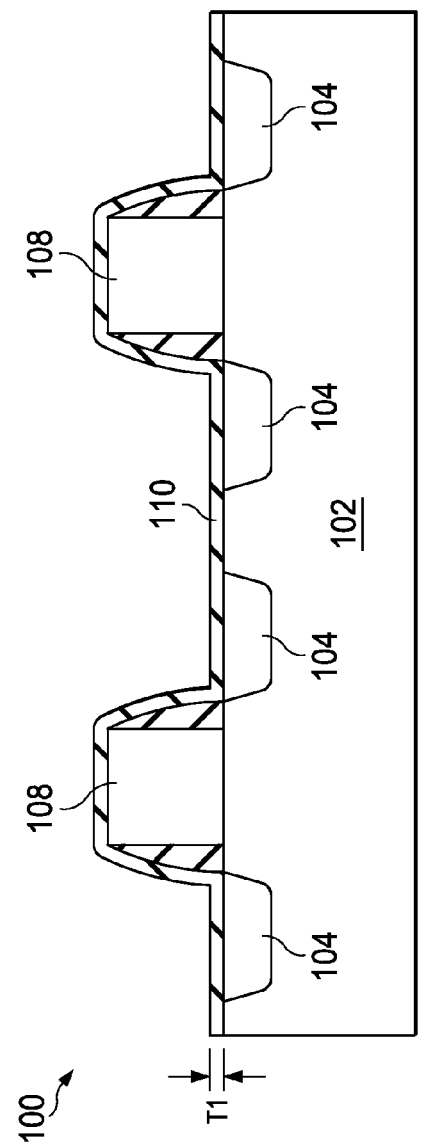

HIGH PERFORMANCE SELF ALIGNED CONTACTS AND METHOD OF FORMING SAME

BACKGROUND

In the manufacturing of integrated circuits, patterning techniques such as photolithography and etching are used to form various features such as interconnect structures, source/drain contacts, and the like in device dies on a wafer. As design features in integrated circuits become increasingly downsized (e.g., having smaller critical dimensions), the accuracy of photolithography and etching tools are be challenged. Due to process limitations of photolithography/etching, misalignments may occur during patterning. These misalignments may damage structures near a patterned feature and create device defects, which may negatively affect device performance and yield.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 9 illustrate various intermediary stages of manufacturing self-aligned contacts in accordance with some embodiments.

DETAILED DESCRIPTION

Figure 3:
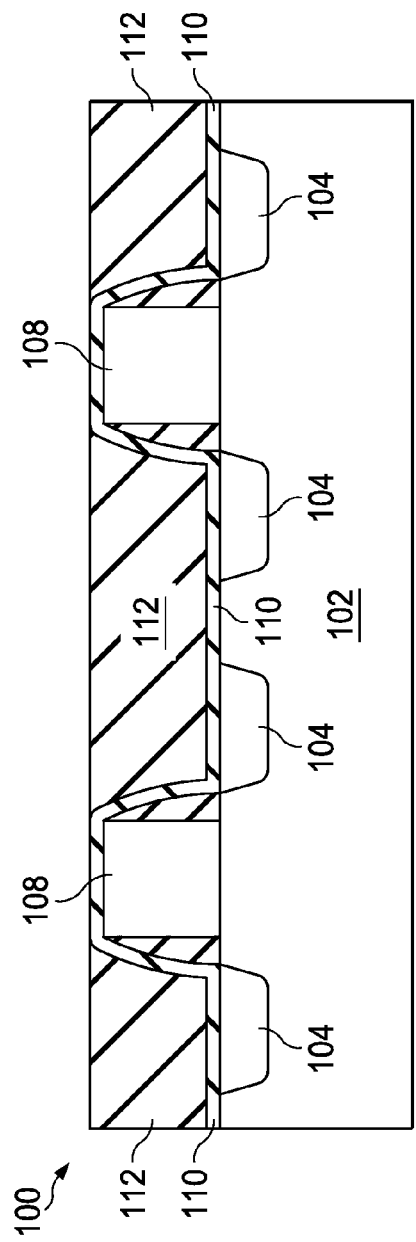

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include the formation of self-aligned contacts in an inter-layer dielectric (ILD). Prior to patterning the contacts, a protective liner (e.g., a metal dielectric) may be conformably formed over nearby gate spacers/gate stacks (or other nearby device features) to protect the gate stack from any damage that may occur due to misalignment errors. The protective layer may have a relatively high etch selectivity compared to the surrounding ILD layer. Thus, in the event that misalignment errors (e.g., caused by limitations of the patterning process) occur, the protective liner prevents damage to the underlying device feature. The inclusion of a protective liner increases the process window for forming such contacts and protects nearby device features from damage during the patterning process.

FIGS. 1 through 9 illustrate cross-sectional views of various intermediary stages of manufacturing a semiconductor device 100 in accordance with various embodiments. FIG. 1 illustrates a device 100 having a semiconductor substrate 102. Substrate 102 may be bulk silicon substrate although other semiconductor materials such as other group III, group IV, or group V semiconductor materials may also be used. Alternatively, substrate 102 may be a silicon-on-insulator (SOI) substrate, or the like. Substrate 102 may be doped with a p-type and/or an n-type impurity.

Active regions, such as source/drain regions 104 may be formed on a top surface of substrate 102. In some embodiments, source/drain regions 104 may include lightly doped source/drain (LDD) regions and source/drain silicide regions. Substrate 102 may further include one or more shallow trench isolation (STI) regions (not shown) disposed between certain source/drain regions 104. Source/drain regions 104 are formed on either side of gate spacers 106. Gate spacers 106 may be formed of silicon oxide, silicon nitride, or the like, and may have a multi-layer structure, for example, with a silicon nitride layer over a silicon oxide layer.

Dummy gate stacks 108 are disposed between respective gate spacers 106. Dummy gate stack 108 may include a dummy oxide layer, a dummy gate over the dummy oxide layer, and a hard mask (e.g., silicon nitride, or the like) over the dummy gate. In some embodiments, the dummy gate is formed using polysilicon, although other materials such as metal silicides, metal nitrides, or the like may be used. The formation of the various elements of device 100 illustrated by FIG. 1 may be done using any suitable method.

Referring next to FIG. 2, a protective liner 110 may be formed over substrate 102, gate spacers 106, and dummy gate stack 108. Protective liner 110 may be formed using a conformal deposition process such as atomic layer deposition (ALD), or the like. Protective liner 110 may cover a top surface of substrate 102, a top surface of dummy gate stack 108 and exposed sidewalls of gate spacers 106. Protective liner 110 may have a thickness T1 of about 10 Å to about 200 Å although protective liner 110 may have other dimensions in alternative embodiments.

Figure 7:
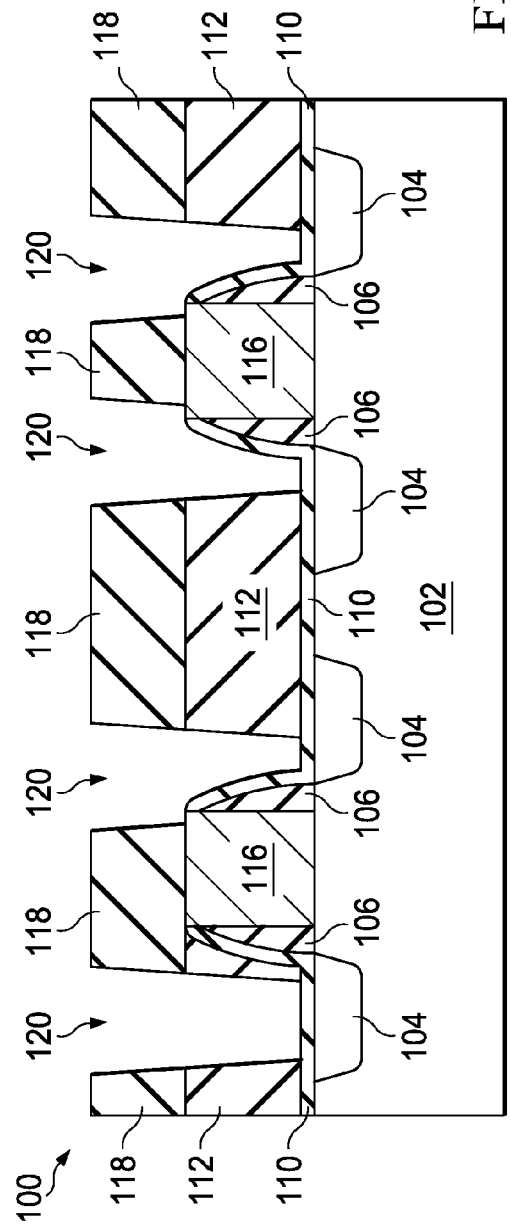

In some embodiments, protective liner 110 may be formed of a material having a relatively high etch selectivity compared to gate spacers 106. For example, protective liner 110 may be a metal dielectric liner comprising aluminum oxide ($AlO_x$), aluminum oxynitride (AlON), aluminum nitride (AlN), titanium oxide ($TiO_x$), titanium oxynitride (TiON), titanium nitride (TiN), and the like. In subsequent patterning steps (e.g., as illustrated by FIG. 7), protective liner 110 may prevent damage to underlying device features due to any misalignment errors during the patterning process.

FIG. 3 illustrates the formation of an inter-layer dielectric (ILD) 112 over substrate 102 and protective liner 110. The formation process of ILD 112 may include blanket forming ILD 112 to a level higher than the top surface of dummy gate stack 108 and protective liner 110. A chemical mechanical polish (CMP) is then performed to planarize ILD 112. The CMP may expose portions of protective liner 110 disposed over dummy gate stack 108. ILD 112 may be formed of a low-k dielectric, for example, having a k-value less than 4.0 or even 2.8. In some embodiments, ILD 112 may be formed of an oxide, nitride, oxynitride, and the like. The formation of ILD 112 may include a suitable blanket deposition process such as ALD, plasma enhanced chemical vapor deposition (PECVD), or the like.

Figure 4:
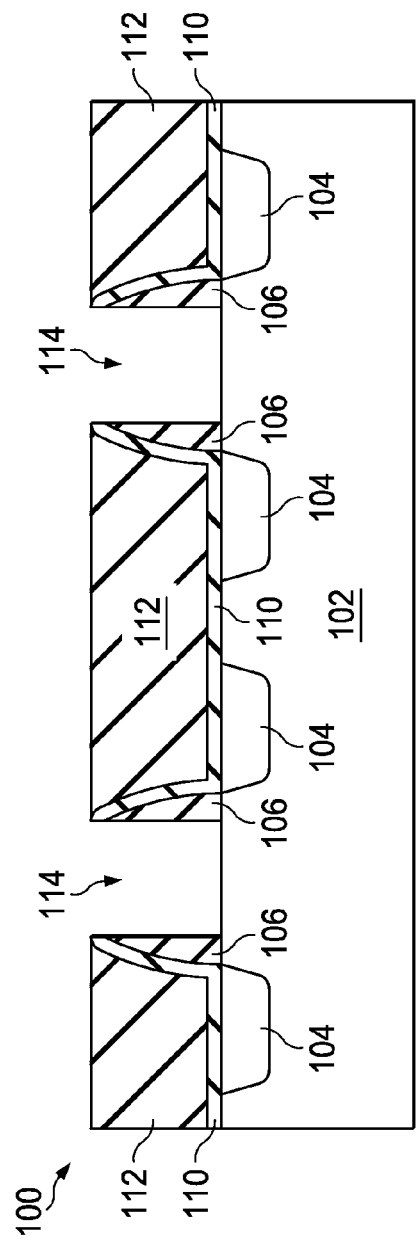
Figure 5:
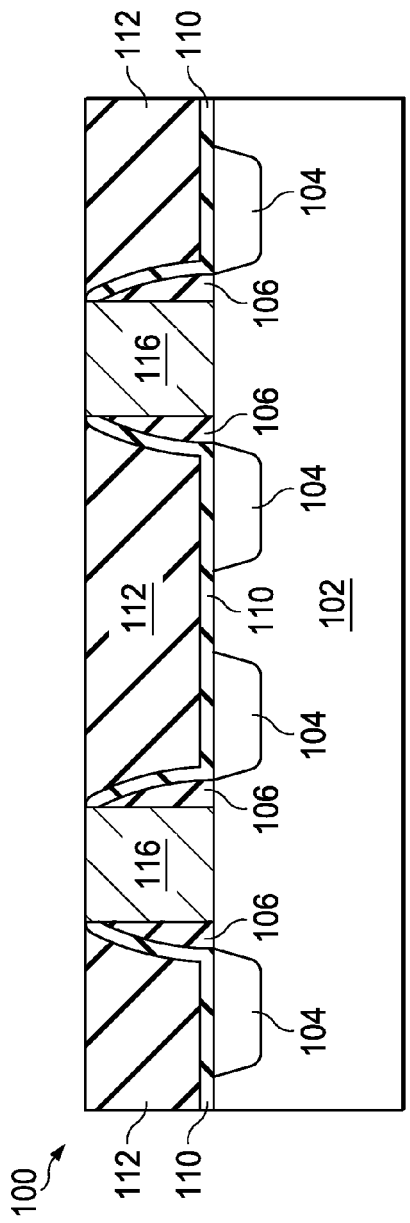

FIGS. 4 and 5 illustrate the replacement of dummy gate stack 108 with conductive gate stack 116. As illustrated by FIG. 4, dummy gate stack 108 may be removed, for example, using dry and/or wet etching processes. The removal of dummy gate stack 108 may include removing exposed portions of protective liner 110 over dummy gate stacks 108. Other portions of protective liner 110 under ILD 112 may not be removed. For example, the portions of protective liner 110 formed on sidewalls of gate spacers 106 may not be removed. Thus, openings 114 are formed between gate spacers 106.

Next, as illustrated by FIG. 5, conductive gate stacks 116 may be formed in openings 114. Although not individually illustrated, conductive gate stacks 116 may include a gate dielectric and a conductive gate material over the gate dielectric. The formation of gate stacks 116 may include blanket depositing a gate dielectric (e.g., silicon oxide, silicon nitride, a high-k dielectric material having a k-value greater than about 7.0, or the like) in openings 114. Suitable blanket deposition processes may include ALD, PECVD, or the like. Next, the conductive gate material may be formed over the gate dielectric. In some embodiments, the conductive gate material may be a metal-containing material such as titanium nitride (TiN), tantalum nitride (TaN), tantalum carbon (TaC), cobalt (Co), ruthenium (Ru), aluminum (Al), combinations thereof, or multi-layers thereof. Subsequently, a CMP is performed to remove excess portions of the gate dielectric and the conductive material (e.g., portions are over a top surface of ILD 112). The remaining portions of the conductive material and gate dielectric thus form gate stacks 116 between gate spacers 106. Top surfaces of gate stacks 116 and ILD 112 may be substantially level. In some embodiments, conductive gate stacks may further include a hard mask (e.g., a nitride) over the conductive material.

Figure 6:
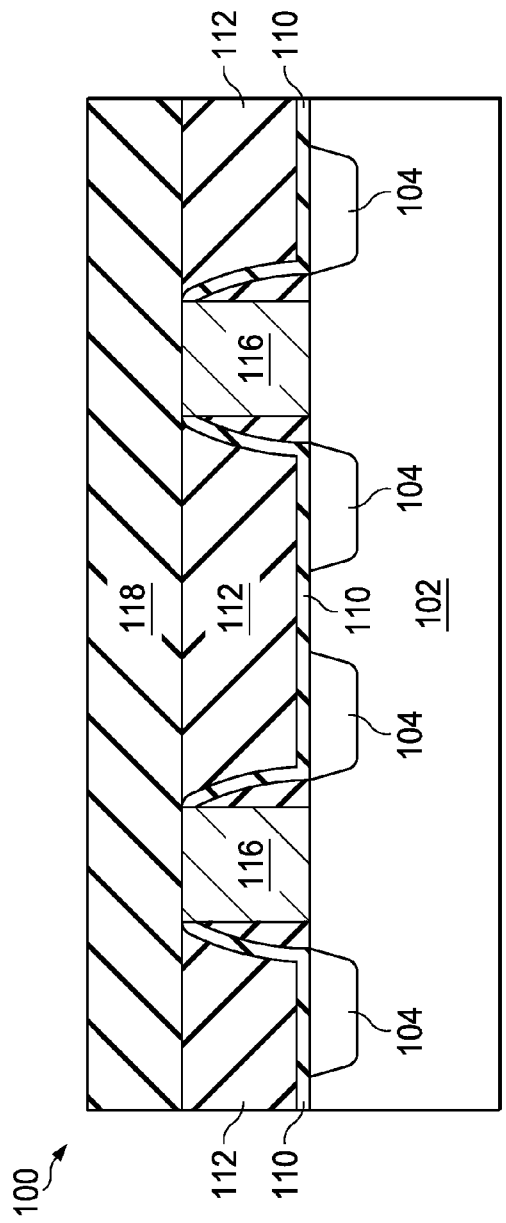

FIG. 6 illustrates the formation of ILD 118 over ILD 112 and gate stacks 116. ILD 118 may be blanket deposited over ILD 112 and gate stacks 116 using a substantially similar method as the deposition of ILD 112. ILD 118 may be formed of a low-k dielectric material, which may the same or a different dielectric material as ILD 112. For example, in some embodiments, ILD 112 is an oxide layer while ILD 118 is a nitride layer. Other materials may be used for ILDs 112 and 118 in other embodiments.

Figure 9:
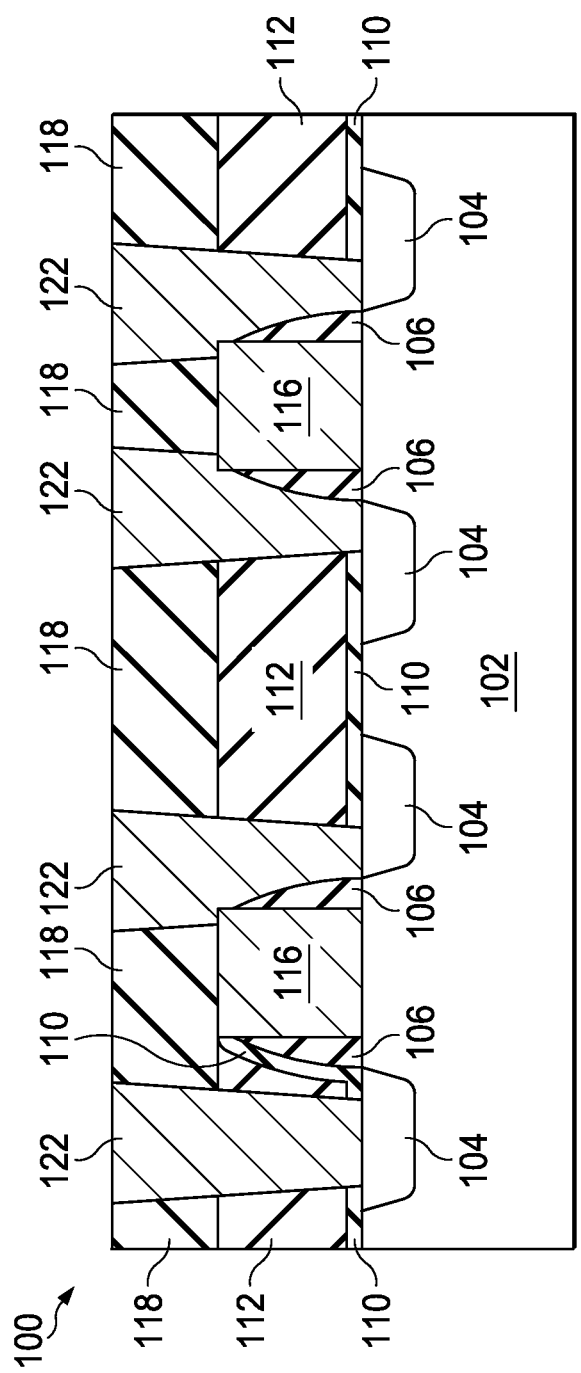

FIG. 7 illustrates the patterning of ILDs 118 and 112 to form contact openings 120, for example, using a combination of photolithography and etching. Contact openings 120 are aligned with source/drain regions 104. In subsequent process steps (e.g., as illustrated by FIG. 9), contact openings 120 may be filled with a conductive material to form contacts electrically connected to source/drain regions 104.

As previously discussed, limitations of the patterning process may cause the misalignment of some contact openings 120. For example, in a typical patterning process, a photoresist (not shown) may be formed over ILD 118. The photoresist may be patterned by exposing portions of the photoresist using a photomask. Exposed or unexposed portions of the photoresist are removed depending on whether a positive or negative resist is used. The patterned photoresist is then used as a patterning mask during the etching of contact openings 120 in ILDs 118/112. Due to limitations of photolithography, the patterned photoresist may be misaligned and certain contact openings 120 in ILD 118 may overlap with gate spacers 106 and even gate stack 116. Subsequently, when ILDs 118 and 112 are etched using the photoresist as a patterning mask, the etching process may also etch gate spacers 106/gate stack 116.

Protective liner 110 prevents damage to gate spacers 106 and gate stack 116 during the etching of contact openings 120 due to any misalignment errors that may occur. Because protective liner 110 has a relatively high etch selectivity compared to gate spacer 106 and ILDs 112/118, the etching process used to pattern contact openings 120 may not etch protective liner 110. For example, the etching process may include a dry etch process using a reaction gas that selectively etches ILD 112/118 without etching protective liner 110. Suitable reaction gases may include a fluorine-based gas, such as a fluorocarbon (e.g., hexafluorobutadiene ($C_4F_6$)). Thus, protective liner 110 acts like an etch stop layer and advantageously prevents damage to underlying features (e.g., gate spacer 106 and gate stack 116) even when patterning misalignment errors occur. Absent protective liner 110, gate spacer 106 and/or gate stack 116 may be inadvertently damaged by the patterning process.

Figure 8:
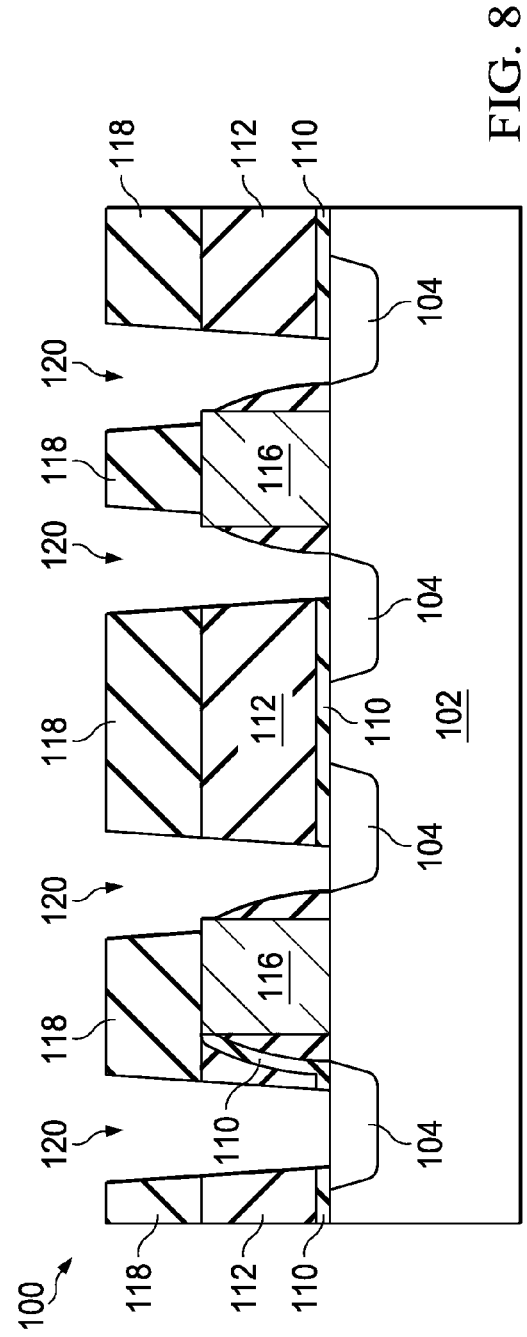

Subsequently, portions of protective liner 110 in contact openings 120 may be removed to expose underlying source/drain regions 104. The removal of protective liner 110 may include a chemical etching process using a reaction gas that selectively etches the material of protective liner 110. Suitable reaction gases may include a chlorine based gas, such as, a combination of chlorine ($Cl_2$) and boron trichloride ($BCl_3$), methyl fluoride ($CH_3F$), and the like. Other unexposed portions of protective liner 110 (e.g., portions under ILD 112) may not be removed. The chemical etching of protective liner in contact openings 120 exposes source/drain regions 104. FIG. 8 illustrates the resulting structure after portions of protective liner 110 in contact openings 120 are removed.

FIG. 9 illustrates the formation of source/drain contacts 122 in contact openings 120. Contacts 122 provide electrical connections to source/drain regions 104. The formation of contacts 122 may include first depositing a seed or barrier layer (e.g., titanium nitride, titanium oxide, tantalum nitride, tantalum oxide, or the like) in contact openings 120. Subsequently, a conductive material (e.g., tungsten, nickel, aluminum, copper, or the like) may be deposited in contact openings 120. The conductive material may overflow contact openings 120, and a CMP may be performed to remove excess portions of the conductive material over ILD 118. Thus, contacts 122 are formed in ILDs 118 and 112 to provide electrical connection to source/drain regions 104.

Figure 10:
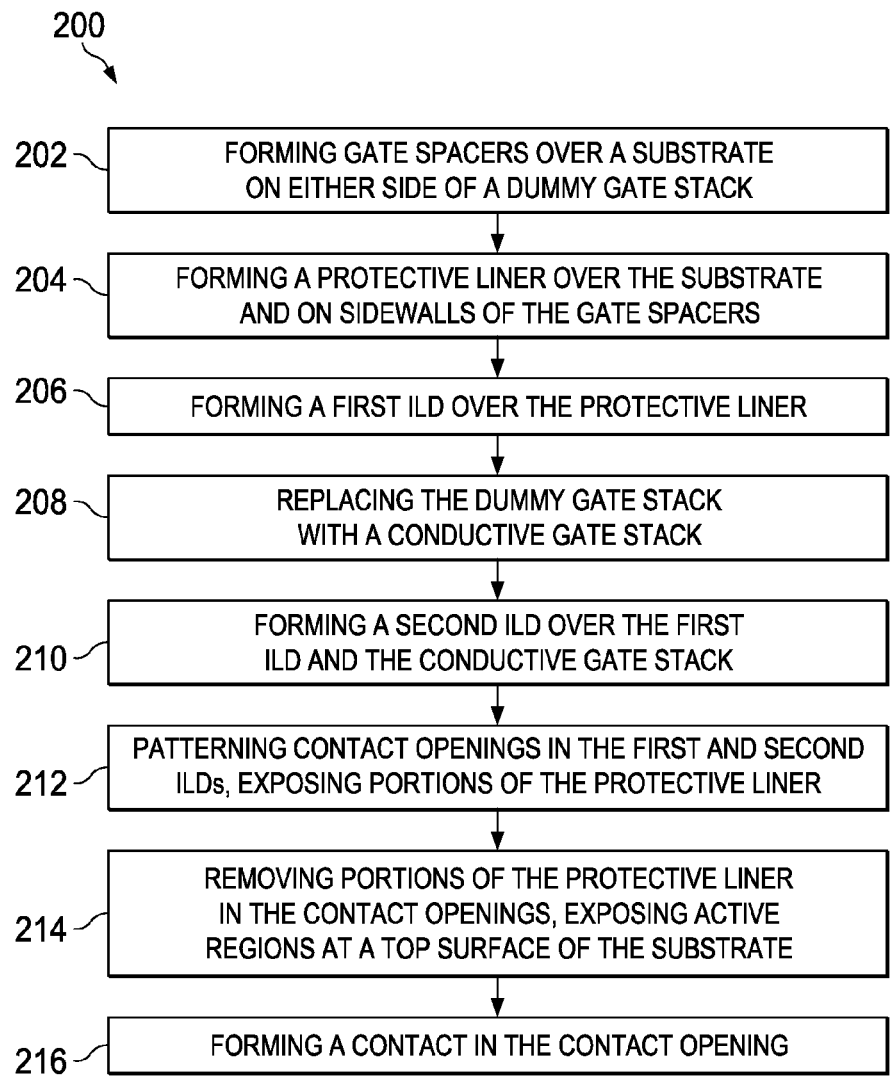
FIG. 10 is a process flow for forming self-aligned contacts in accordance with some embodiments.

FIG. 10 illustrates a process flow 200 of a method for forming contacts in accordance with various embodiments. In step 202, gate spacers (e.g., gate spacers 106) are formed on either side of a dummy gate stack (e.g., dummy gate stack 108). The gate spacers and the dummy gate stack are disposed over a semiconductor substrate. The substrate may include active regions (e.g., source/drain regions 104) formed at a top surface of the substrate and disposed on either side of the gate spacers/dummy gate stack.

Next, in step 204, a protective liner (e.g., protective liner 110) may be formed on sidewalls of the gate spacers. The protective liner may be deposited using a conformal deposition process, and the protective liner may further be formed over top surfaces of the substrate and the dummy gate stack. The protective liner may be formed of a material having a relatively high etch selectivity compared to the gate spacers. For example, the protective liner may be a metal dielectric liner comprising $AlO_x$, AlON, AlN, $TiO_x$, TiON, TiN, and the like.

In step 206, a first ILD (e.g., ILD 112) is formed over the protective liner using, for example, a blanket deposition process. ILD 112 may be deposited to cover the protective liner. Subsequently a CMP may be performed on ILD 112 to expose portions of protective liner over the dummy gate stack. Other portions of the protective liner (e.g., on sidewalls of the gate spacers and over the substrate) may not be exposed.

In step 208, the dummy gate stack is replaced with a conductive gate stack (e.g., conductive gate stack 116). For example, the dummy gate stack may be removed leaving an opening between the gate spacers. The removal of the dummy gate stack may also include removing portions of the protective liner over the dummy gate stack. The conductive gate stack may then be formed in the opening between the gate spacers. Top surfaces of the conductive gate stack and the first ILD may be substantially level. Subsequently, in step 210, a second ILD (e.g., ILD 118) may be formed over the first ILD and the conductive gate stack. The first and second ILDs may be formed of the same or different materials.

Next, in step 212, contact openings (e.g., contact openings 120) are patterned in the first and second ILDs, exposing the protective liner. Each opening is at least partially aligned with an active region at a top surface of the substrate. Due to limitations of the patterning process, the patterning of the contact openings may suffer from misalignment errors, which may misalign the contact openings with the gate spacer or even the conductive gate stack. Because of the relatively high etch selectivity of the protective liner compared to the first and second ILDs and the gate spacers, the protective liner acts as an etch-stop layer during the patterning of the contact openings. Thus, features underlying the protective layer may be protected from etch damage due to any misalignment errors.

In step 214, portions of the protective liner in the contact openings are removed, for example, using a chemical etching process. The chemical etching process may include using a reaction gas that selectively removes the protective liner without removing the first/second ILDs. For example, when the protective liner is a metal dielectric, a combination of $Cl_2$ and $BCl_3$, methyl fluoride $CH_3F$, and the like may be used as a reaction gas. By removing portions of the protective liner in the contact openings, the active regions may be exposed in the contact openings. Other portions of the protective liner not exposed by the contact openings may not be removed. Subsequently, in step 216, the contact openings are filled with a conductive material. Thus, contacts (e.g., contacts 122) are formed, which provide electrical connections to the active regions of the substrate.

Various embodiments include forming a protective liner over a substrate and on sidewalls of gate spacers to protect the gate spacers (and gate stacks between the gate spacers) during the patterning of contact openings. The protective liner may be formed of a material having a relatively high etch selectivity (e.g., a metal dielectric). When contact openings are subsequently patterned, the protective liner acts as an etch stop layer and prevents damage to the gate spacers/gate stack due to any misalignment errors. Even when patterning process limitations cause misalignment errors, nearby features may not be damaged by the patterning. Thus, the use of a protective liner during the formation of contacts improves yield and increases process windows of the contact formation process.

In accordance with an embodiment, a method includes forming a protective liner over a semiconductor substrate and forming an inter-layer dielectric over the protective liner. The protective liner covers a sidewall of a gate spacer. The method further includes patterning a contact opening in the first ILD to expose a portion of the protective liner. The portion of the protective liner in the contact opening is removed to expose an active region at a top surface of the semiconductor substrate. A contact is formed in the contact opening. The contact is electrically connected to the active region.

In accordance with another embodiment, a method includes forming a dummy gate stack over a semiconductor substrate, wherein the dummy gate stack is disposed between gate spacers. A protective liner is conformably deposited over the semiconductor substrate and on exposed sidewalls of the gate spacers. A first inter-layer dielectric (ILD) is formed over the protective liner. The dummy gate stack is replaced with a conductive gate stack, and a contact opening is patterned in the first ILD. The contact opening exposes a first portion of the protective liner. The method further includes exposing an active region at a top surface of the semiconductor substrate by removing the first portion of the protective liner and filling the contact opening with a conductive material.

In accordance with yet another embodiment, a semiconductor device includes a semiconductor substrate having an active region at a top surface. The device further includes a first inter-layer dielectric (ILD) over the semiconductor substrate and a protective liner between the semiconductor substrate and the first ILD. A contact in the first ILD is electrically connected to the active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a dummy gate stack over a semiconductor substrate, wherein the dummy gate stack is adjacent to a gate spacer;

forming a protective liner over the semiconductor substrate, the dummy gate stack and the gate spacer, wherein the protective liner is a metal dielectric liner and covers a sidewall of the gate spacer, and further wherein a first portion of the protective liner is over a top surface of the dummy gate stack and above an uppermost surface of the gate spacer and a second portion of the protective liner over an active region at a top surface of the semiconductor substrate;

forming a first inter-layer dielectric (ILD) over the protective liner;

replacing the dummy gate stack with a conductive gate stack, the replacing comprising:

performing a chemical mechanical polish (CMP) process on the ILD to expose the first portion of the protective liner; and after performing the CMP process, etching the first portion of the protective liner to expose the dummy gate stack;

patterning a contact opening in the first ILD, exposing the second portion of the protective liner;

removing the second portion of the protective liner, exposing the active region; and forming a contact in the contact opening, wherein the contact is electrically connected to the active region.

2. The method of claim 1, wherein the protective liner comprises aluminum oxide ($AlO_x$), aluminum oxynitride (AlON), aluminum nitride (AlN), titanium oxide ($TiO_x$), titanium oxynitride (TiON), titanium nitride (TiN), or a combination thereof.

3. The method of claim 1, wherein forming the protective liner comprises a conformal deposition process.

4. The method of claim 1, wherein removing the second portion of the protective liner comprises a chemical etching process.

5. The method of claim 4, wherein the chemical etching process comprises using chlorine ($Cl_2$) in combination with boron trichloride ($BCl_3$) or methyl fluoride ($CH_3F$) as a reaction gas.

6. The method of claim 1 further comprising forming a second ILD over the first ILD, wherein patterning the contact opening comprises patterning the second ILD.

7. A method comprising:
forming a dummy gate stack over a semiconductor substrate, wherein the dummy gate stack is disposed between gate spacers;
conformally depositing a protective liner over the semiconductor substrate and on exposed sidewalls of the gate spacers and over a top surface of the dummy gate stack;
forming a first inter-layer dielectric (ILD) over the protective liner;
replacing the dummy gate stack with a conductive gate stack, wherein replacing the dummy gate stack comprises:
performing a chemical mechanical polish (CMP) process on the ILD to expose a first portion of the protective liner over the top surface of the dummy gate stack, the first portion of the protective liner being above an uppermost surface of the gate spacer; and
etching the first portion of the protective liner to expose the dummy gate stack;
patterning a contact opening in the first ILD, wherein the contact opening exposes a second portion of the protective liner over the semiconductor substrate;
exposing an active region at a top surface of the semiconductor substrate by removing the second portion of the protective liner over the semiconductor substrate; and
filling the contact opening with a conductive material.

8. The method of claim 7, wherein the protective liner is a metal dielectric liner comprising aluminum oxide ($AlO_x$), aluminum oxynitride (AlON), aluminum nitride (AlN), titanium oxide ($TiO_x$), titanium oxynitride (TiON), titanium nitride (TiN), or a combination thereof.

9. The method of claim 7, wherein exposing the active region comprises chemically etching the protective liner.

10. The method of claim 9, wherein chemically etching the protective liner comprises using chlorine ($Cl_2$) in combination with boron trichloride ($BCl_3$) or methyl fluoride ($CH_3F$) as a reaction gas.

11. The method of claim 7, wherein the contact opening exposes at least a portion of a sidewall of one of the gate spacers, the conductive material physically contacting the exposed portion of the sidewall of the one gate spacer.

12. The method of claim 7, further comprising forming a second ILD over the first ILD, wherein patterning the contact opening comprises patterning the second ILD.

13. A method comprising:
providing a first gate stack spaced apart from a source/drain region by a gate spacer disposed on a sidewall of the first gate stack;
conformally depositing a metal dielectric layer on a top surface of the source/drain region and a sidewall of the gate spacer;
forming a dielectric layer over the metal dielectric layer; and
forming a contact extending through the dielectric layer and electrically connected to the source/drain region, wherein forming the contact comprises:
patterning the dielectric layer to expose the metal dielectric layer; and
etching an exposed portion of the metal dielectric layer to expose the source/drain region and a portion of the sidewall of the gate spacer.

14. The method of claim 13, wherein etching the exposed portion of the metal dielectric layer comprises using chlorine ($Cl_2$) in combination with boron trichloride ($BCl_3$) or methyl fluoride ($CH_3F$) as a reaction gas.

15. The method of claim 13, wherein conformally depositing the metal dielectric layer comprises conformally depositing a portion of the metal dielectric layer on a top surface of the first gate stack.

16. The method of claim 15 further comprising:
planarizing the dielectric layer to expose the portion of the metal dielectric layer on the top surface of the first gate stack but not exposing the gate spacer;
exposing the first gate stack by etching the portion of the metal dielectric layer on the top surface of the first gate stack without removing other portions of the metal dielectric layer disposed under the dielectric layer; and
replacing the first gate stack with a second gate stack.

17. The method of claim 13, wherein after etching the exposed portion of the metal dielectric layer, other portions of the metal dielectric layer remain under the dielectric layer.

18. The method of claim 1, wherein exposing the active region at the top surface of the semiconductor substrate further comprises exposing a portion of the sidewall of the gate spacer.

19. The method of claim 1, wherein the protective liner has a thickness of about 10 Å to about 200 Å.

20. The method of claim 13, wherein forming the contact further comprises:
after etching the exposed portion of the metal dielectric layer, filling an opening with a conductive material, the opening being formed by the patterning the dielectric layer and the etching the exposed portion of the metal dielectric layer.

* * * * *